US010281542B2

(12) United States Patent
McKinnon et al.

(10) Patent No.: US 10,281,542 B2
(45) Date of Patent: May 7, 2019

(54) MAGNETIC RESONANCE IMAGING SYSTEM AND METHOD

(71) Applicant: General Electric Company, Schenectady, NY (US)

(72) Inventors: Graeme McKinnon, Hartland, WI (US); Shaorong Chang, Waukesha, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 596 days.

(21) Appl. No.: 14/871,088

(22) Filed: Sep. 30, 2015

(65) Prior Publication Data

US 2017/0089993 A1   Mar. 30, 2017

(51) Int. Cl.
*G01R 33/48* (2006.01)
*G01R 33/565* (2006.01)
*G01R 33/385* (2006.01)

(52) U.S. Cl.
CPC ..... *G01R 33/4816* (2013.01); *G01R 33/4826* (2013.01); *G01R 33/56545* (2013.01)

(58) Field of Classification Search
CPC .... G01R 33/561; G01R 33/56; G01R 33/565; G01R 33/54; G01R 33/4833
See application file for complete search history.

(56) References Cited

U.S. PATENT DOCUMENTS

| | | | | |
|---|---|---|---|---|
| 2005/0073303 A1* | 4/2005 | Harer | ................. | G01R 33/4824 324/307 |
| 2006/0079754 A1* | 4/2006 | Welch | ................. | G01R 33/4824 600/410 |
| 2008/0183067 A1* | 7/2008 | Shu | ..................... | G01R 33/4824 600/410 |
| 2008/0258727 A1* | 10/2008 | Qian | .................. | G01R 33/4816 324/312 |
| 2011/0095762 A1* | 4/2011 | Piccini | ............... | G01R 33/4824 324/312 |
| 2016/0187446 A1* | 6/2016 | Zhou | .................. | G01R 33/5611 324/309 |

OTHER PUBLICATIONS

S. Hafner; "Fast Imaging in Liquids and Solids With the Back-Projection Low Angle Shot (Blast) Technique"; Magnetic Resonance Imaging; 1994; vol. 12, No. 7, pp. 1047-1051.

David P. Madio, Irving J. Lowe; "Ultra-Fast Imaging Using Low Flip Angles and FIDs"; Department of Physics and astronomy, University of Pittsburg and Pittsburg NMR Center of Biomedical Research; Carnegie Mellon University; 1995; MRM 34; 525/529; Pittsburg, Pennsylvania, USA.

(Continued)

*Primary Examiner* — Jermele M Hollington
*Assistant Examiner* — Suresh K Rajaputra
(74) *Attorney, Agent, or Firm* — Grogan, Tuccillo & Vanderleeden LLP (57) ABSTRACT

A method of magnetic resonance imaging includes executing an imaging sequence, in response to the imaging sequence, acquiring magnetic resonance data, entering the acquired magnetic resonance data in k-space in a memory along a predetermined k-space trajectory, and modifying the k-space trajectory during acquisition of the magnetic resonance data.

15 Claims, 7 Drawing Sheets

(56) References Cited

OTHER PUBLICATIONS

Markus Weiger, David O. Brunner, Benjamin E. Dietrich, Colin F. Muller, and Klaas P. Bruessman; "ZTE Imaging in Humans"; Magnetic Resonance in Medicine, 00:00-00; 2013; pp. 1-5; Institute for Biomedical Engineering, University and ETH Zurich, Zurich, Switzerland.

Markus Weiger, Klaas P. Bruessman and Franciszek Hennel; "MRI With Zero Echo Time: Hard Versus Sweep Pulse Excitation"; Magnetic Resonance in Medicine, 66:379-389; 2011.

\* cited by examiner

FIG. 10

MAGNETIC RESONANCE IMAGING SYSTEM AND METHOD

BACKGROUND

Technical Field

Embodiments of the invention relate generally to magnetic resonance imaging and, more specifically, to a system and method to mitigate artifacts in 3D radial images.

Discussion of Art

Magnetic Resonance Imaging (MRI) is a widely accepted and commercially available technique for obtaining digitized visual images representing the internal structure of objects having substantial populations of atomic nuclei that are susceptible to nuclear magnetic resonance (NMR). In MRI, imposing a strong main magnetic field ($B_0$) on the nuclei polarizes nuclei in the object to be imaged. The nuclei are excited by a radio frequency (RF) signal at characteristic NMR (Larmor) frequencies. By spatially distributing localized magnetic fields surrounding the object and analyzing the resulting RF responses from the nuclei as the excited protons relax back to their lower energy normal state, a map or image of these nuclei responses as a function of their spatial location is generated and displayed. An image of the nuclei responses provides a non-invasive view of an object's internal structure.

Since the discovery of NMR imaging, a variety of different imaging schemes have been developed to improve image quality or to fit special requirements. Relatively recently, a zero echo time (ZTE) imaging technique was discovered that substantially decreased the image acquisition echo time. Zero echo time can be obtained in MRI by performing RF excitation as well as acquisition in the presence of a constant gradient applied for purely frequency-encoded, radial center-out k-space encoding. With existing 3D radial imaging sequences, however, image artifacts, such as subtle streaking in some central slices when acquiring head images with an axial orientation, have been observed.

What is needed, therefore, is a system and method that improves overall imaging performance and, in particular, eliminates artifacts during 3D radial head imaging when acquiring with an axial orientation.

BRIEF DESCRIPTION

In an embodiment, a method of magnetic resonance imaging is provided. The method includes the steps of executing an imaging sequence, in response to the imaging sequence, acquiring magnetic resonance data, entering the acquired magnetic resonance data in k-space in a memory along a predetermined k-space trajectory, and modifying the k-space trajectory during acquisition of the magnetic resonance data.

In another embodiment, a method of mitigating an artifact in an axial-acquired three-dimensional radial image includes the steps of executing an imaging sequence, in response to the imaging sequence, acquiring magnetic resonance data, entering the acquired magnetic resonance data in k-space in a memory along straight-line radial spokes, defining each of the radial spokes in k-space by one point among a plurality of points on a sphere, and a center point of the sphere, the center point of the sphere coinciding with a center of k-space, an orientation of the radial spokes defining a k-space trajectory, and modifying the k-space trajectory during the step of acquiring the magnetic resonance data.

In yet another embodiment, a magnetic resonance imaging system configured for data acquisition of magnetic resonance data in three-dimensional k-space is provided. The system includes a magnetic resonance data acquisition system including a memory into which acquired magnetic resonance data are entered in k-space, and a control unit configured to operate the data acquisition system in order to enter acquired magnetic resonance data in k-space in the memory along straight-line spokes, wherein k-space in said the includes a center of k-space. The memory is configured to define each of the spokes in k-space by one point among a plurality of points on a sphere, and a center point of the sphere, the center point of the sphere coinciding with the center of k-space. The orientation of the radial spokes define a k-space trajectory. The control unit is further configured to modify the k-space trajectory during data acquisition.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled, "electrically connected" and "electrical communication" means that the referenced elements are directly or indirectly connected such that an electrical current may flow from one to the other. The connection may include a direct conductive connection (i.e., without an intervening capacitive, inductive or active element), an inductive connection, a capacitive connection, and/or any other suitable electrical connection. Intervening components may be present. As will be appreciated, embodiments of the present invention may be used to analyze animal tissue and other objects, generally, and are not limited to human tissue. Moreover, while the embodiments described herein relate specifically to axial brain imaging, the present invention contemplates imaging other body regions and in different orientations when the sensitive region of the coil is larger than the imaging region.

Figure 1:
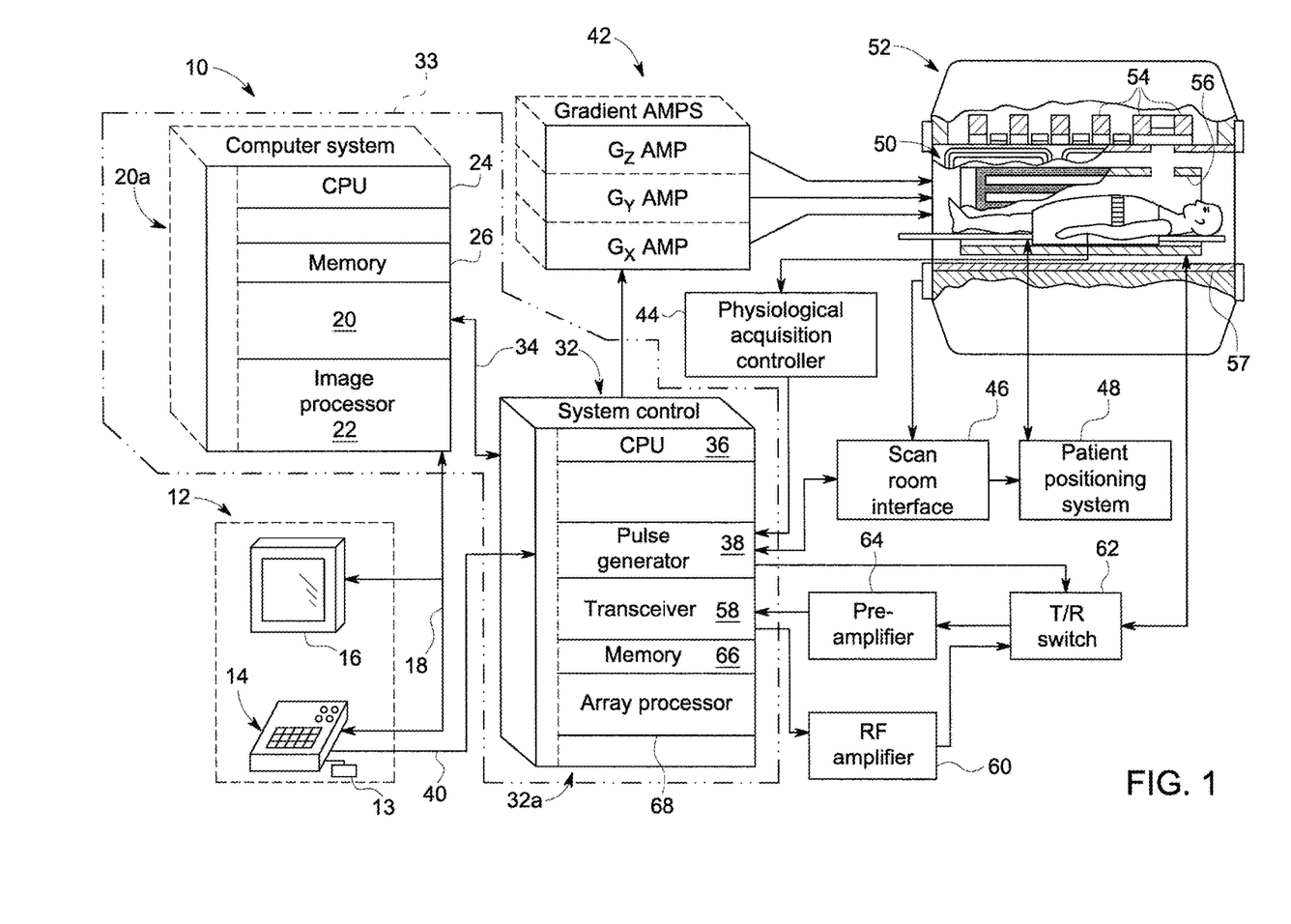
FIG. 1 depicts schematically an exemplary magnetic resonance imaging (MRI) system that incorporates embodiments of the invention.

Referring to FIG. 1, the major components of a magnetic resonance imaging (MRI) system 10 incorporating an embodiment of the invention are shown. Operation of the system is controlled from an operator console 12, which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 communicates with a separate system control or control unit 32 through a high-speed serial link 34. The input device 13 can include a mouse, joystick, keyboard, track ball, touch activated screen, light wand, voice control, or any similar or equivalent input device, and may be used for interactive geometry prescription. The computer system 20 and the MRI system control 32 collectively form an "MRI controller" 33.

The MRI system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to execute the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The pulse generator module 38 operates the gradient amplifiers 42 to achieve desired timing and shape of the gradient pulses that are produced during the scan. The gradient waveforms produced by the pulse generator module 38 are applied to the gradient amplifier system 42 having Gx, Gy, and Gz amplifiers. Each gradient amplifier excites a corresponding physical gradient coil in a gradient coil assembly, generally designated 50, to produce the magnetic field gradients used for spatially encoding acquired signals. The gradient coil assembly 50 forms part of a magnet assembly 52, which also includes a polarizing magnet 54 (which, in operation, provides a homogeneous longitudinal magnetic field B0 throughout a target volume 55 that is enclosed by the magnet assembly 52) and a whole-body (transmit and receive) RF coil 56 (which, in operation, provides a transverse magnetic field B1 that is generally perpendicular to B0 throughout the target volume 55).

The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

As alluded to above, the MRI system 10 may be configured to implement a variety of different imaging schemes such as, for example, a 3D radial imaging (ZTE) scheme, as is known in the art. As will be readily appreciated, ZTE imaging is a robust and silent 3D radial technique suitable for direct MRI of tissues with very rapid transverse relaxation that employs three-dimensional center out encoding. The ZTE technique is characterized by a particularly high efficiency due to instant spatial encoding at full bandwidth and the intrinsic potential for highest acquisition duty cycle. The ZTE technique is particularly applicable to samples with short transverse relaxation times. In particular, MRI of samples with short transverse relaxation times T2 requires data acquisition to take place as soon as possible after signal excitation. The echo time parameter TE describes the ability of the MRI sequence to meet this demand as it is commonly defined as the time that elapses between the excitation of a signal and its passage through the center of k-space (k=0) with the chosen trajectory. TE can be kept especially short with purely frequency-encoded methods that start acquiring signals immediately after excitation without the need for preceding encoding gradients, using, for example, radial center-out trajectories.

Figure 2:
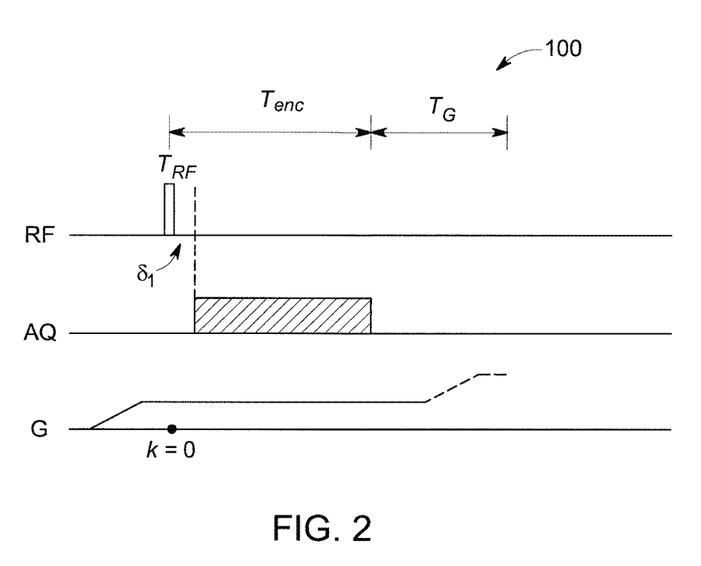
FIG. 2 illustrates an exemplary acquisition scheme for one readout of 3D radial MRI with zero echo time.

Zero echo time is obtained with methods in which the gradient is already on during the RF excitation, as illustrated in FIG. 2, which is discussed in further detail below. This ZTE approach precludes conventional slice selection and thus requires a three-dimensional (3D) encoding scheme. To keep total scan times to a minimum, ZTE techniques are usually operated with short pulse repetition times (TR) and small flip angles in a steady state of the magnetization. As will be readily appreciated, in the ZTE approach, the readout gradient does not need to be switched on and off between successive repetitions but can be gradually changed in small steps, thus making the method virtually silent. In addition, most of the scan time is utilized for data acquisition with only the RF pulse and the time required for one gradient step, permitting particularly fast 3D scanning.

Further to the above, as a specific requirement the RF excitation must cover the entire bandwidth spanned by the readout gradient across the field of view (FOV). This is especially demanding when targeting signals with very short T2, which require rapid encoding with strong gradients. High-bandwidth excitation may be accomplished by means of sufficiently short, hard pulses, as is known in the art. As used herein, "hard pulse" means a pulse that provides a wide uniform excitation profile without any intrinsic intensity loss or signal phase distortion over a specified frequency range.

With further reference to FIG. 2, an exemplary acquisition scheme 100 for one readout of 3D radial MRI with ZTE is illustrated. The projection gradient is set to the required direction and amplitude before RF excitation/pulse and remains constant until adjusted for the next repetition. Thus center-out encoding begins with the excitation, and k=0 can be assigned to a position inside the pulse. Gradient encoding of duration $T_{enc}$ is applied, thus with a nominal resolution of dr in a given FOV, a bandwidth of $bw=M/(2T_{enc})$ is created, where M=FOV/dr. According to the Nyquist criterion, the signal must be sampled with acquisition intervals of maximum duration $dw=1/bw=2T_{enc}/M$. As shown in FIG. 2, after the hard pulse of duration $T_{RF}$ and a delay $\delta_1$ for changing to receive operation, data is acquired until the desired encoding has been achieved. The subsequent interval of duration $T_G$ is required for changing to the next gradient value and for gradient spoiling, if necessary. Neglecting the short duration of the RF pulse results in a repetition time for the hard-pulse scheme of $TR=T_{enc}+T_G$ where, again, $T_{enc}$ is the encoding duration and $T_G$ is the time for adjusting the gradient. After the hard pulse and the delay for transmit/receive switching, the acquisition starts and the data is filtered. A virtually silent gradient operation can be achieved by employing the gradients in a continuous mode and keeping amplitude changes small by selecting successive radial directions on a spiral-shaped path on the surface of a sphere.

Figure 3:
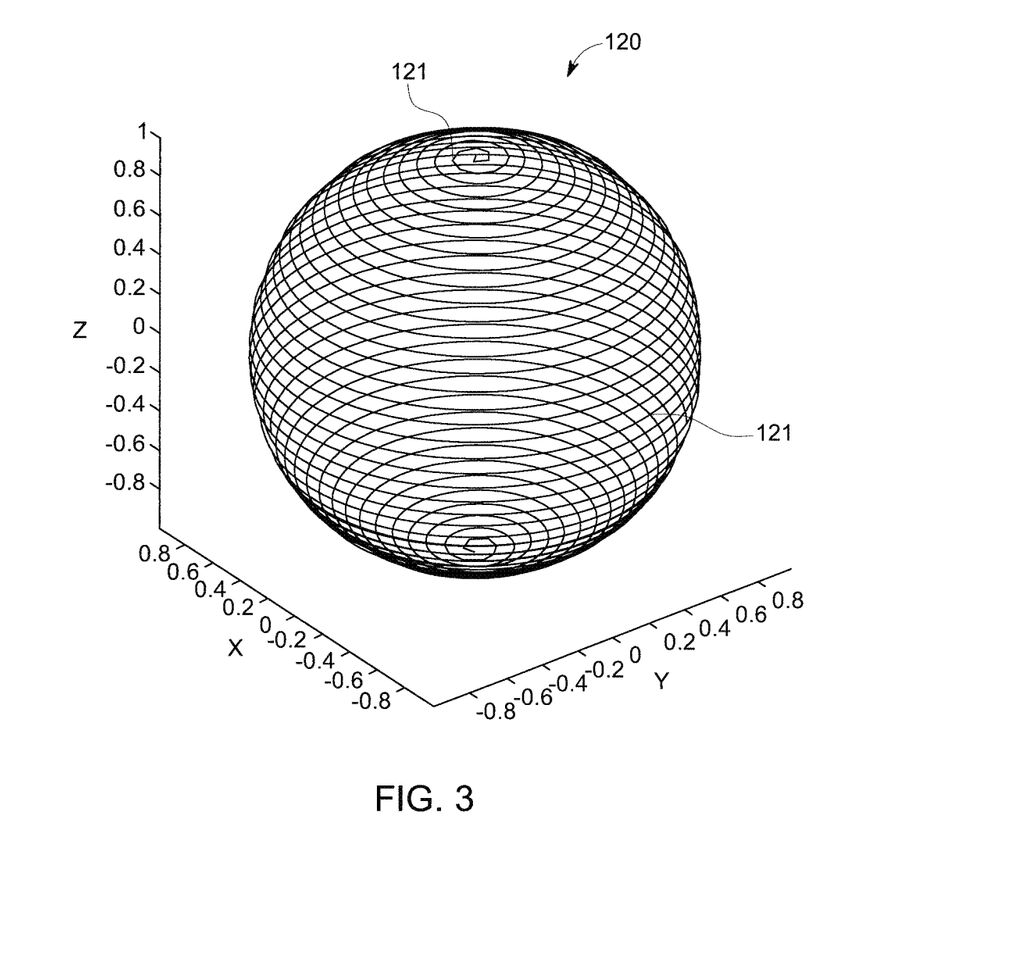
FIG. 3 is a diagram of a spoke end-point trajectory for the acquisition scheme of FIG. 2.
Figure 4:
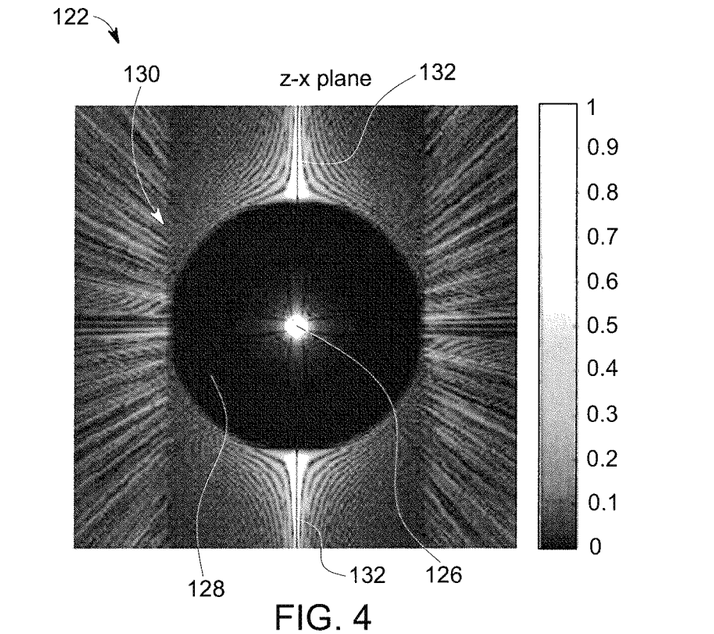
FIG. 4 shows the point spread function for the spoke end-point trajectory shown in FIG. 3, for the z-x plane.
Figure 5:
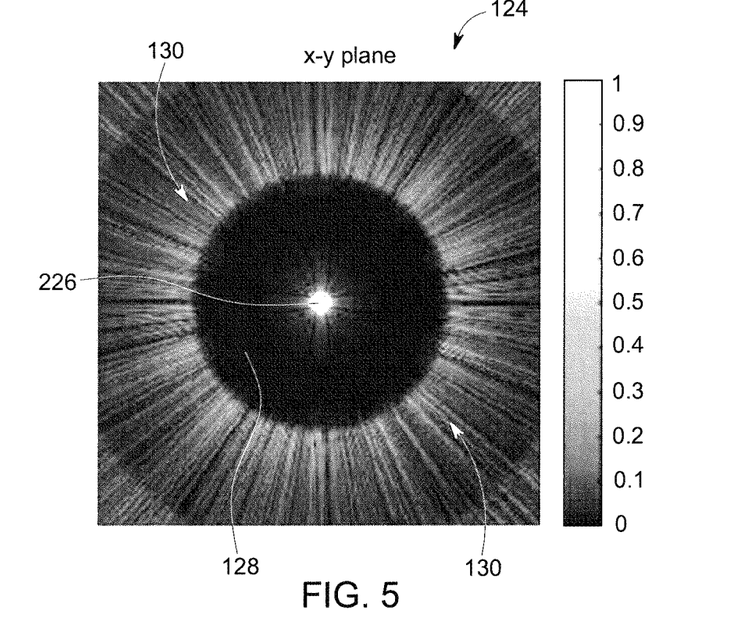
FIG. 5 shows the point spread function for the spoke end-point trajectory shown in FIG. 3, for the x-y plane.

Referring now to FIG. 3, an exemplary spoke end point trajectory 120 for the acquisition scheme of FIG. 2 is illustrated. Each spoke is defined by a point on the sphere and the center point of this sphere. In other words, each spoke on which the points in k-space are detected runs through this center point (which is located in the center of k-space) and through the corresponding point on the sphere. A spoke is thus differentiated from the other spokes by the corresponding point on the sphere since each spoke runs through the center point. As will be readily appreciated, the lines between the end points of each spoke represent the transition from one spoke to the next. Short lines equal a small variation in the gradient of the magnetic field that is necessary for data acquisition. As shown in FIG. 3, the k-space points on the sphere lie on a trajectory which possesses the shape of a three-dimensional, smooth spiral 121, from the positive z-axis to the negative z-axis. The point spread function (PSF) of this is shown in FIGS. 4 and 5, for the z-x plane 122 and x-y plane 124, respectively. As shown therein, the PSF is characterized by a bright spot 126 at the center, a region 128 of near zero intensity with a radius equal to the imaging field of view (FOV) (defined by the Nyquist sampling criteria), and then a streaky region 130 outside of that. However, outside of the central region 128, the PSF shows a bright polar region 132 with strong intensity orientated with the z-axis.

Figure 6:
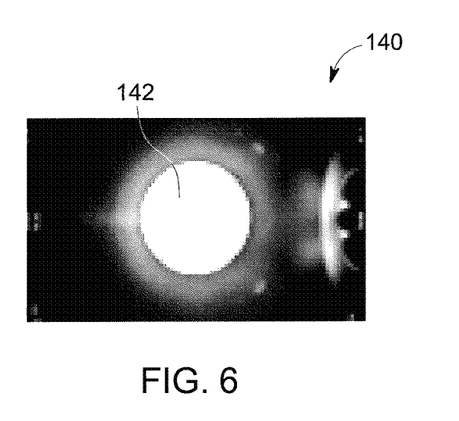
FIG. 6 is a sagittal image acquired utilizing existing 3D radial zero echo time imaging techniques.

The resulting 3D radial image corresponds to the convolution of the PSF with part of the object excited by the transmit field and detected by the receiving coil. The result is that parts of the excited object outside of the Nyquist FOV are aliased back into the imaging FOV. This aliased signal generally appears as a low level background noise. However, the aliased signal from the strong PSF intensity region 132 along the poles can appear as a streak-like artifact in the image. With certain coils, the excited object may be much larger than the region of interest, such as when imaging the brain region. For example, FIG. 6 illustrates a 48 cm FOV sagittal image 140. As shown therein, the image 140 shows a bright sphere 142 in the center, but still considerable signal from the distorted box-like phantom. The boxlike phantom can cause streak artifacts in the region of the sphere, which is particularly undesirable. These streak like artifacts have typically been observed in central slices when acquiring with an axial orientation.

In connection with the above, embodiments of the present invention provide a method for mitigating and/or eliminating such artifacts resulting from 3D radial imaging with zero echo time. In connection with this, it has been discovered that the bright polar PSF region (e.g., polar region 132 shown in FIG. 4 in the z-x plane) is caused by the regular planar-like spacing of the spoke end-points in the equatorial region of the trajectory (e.g., see FIG. 2). By modifying, e.g., modulating, the polar angle of the trajectory in a regular sinusoidal manner, this bright PSF region 132 can be dispersed. In particular, by disturbing the regular spacing of the radial spokes, particularly in the equatorial plan, with a sinusoidal modulation substantially artifact-free images may be acquired.

As used herein, "modifying" k-space trajectory includes, but is not limited to, modulation of the same using various techniques such as sinusoidal or random modulation. In certain embodiments, other trajectory modifications may be utilized, provided they have the desired effect on image quality.

Figure 7:
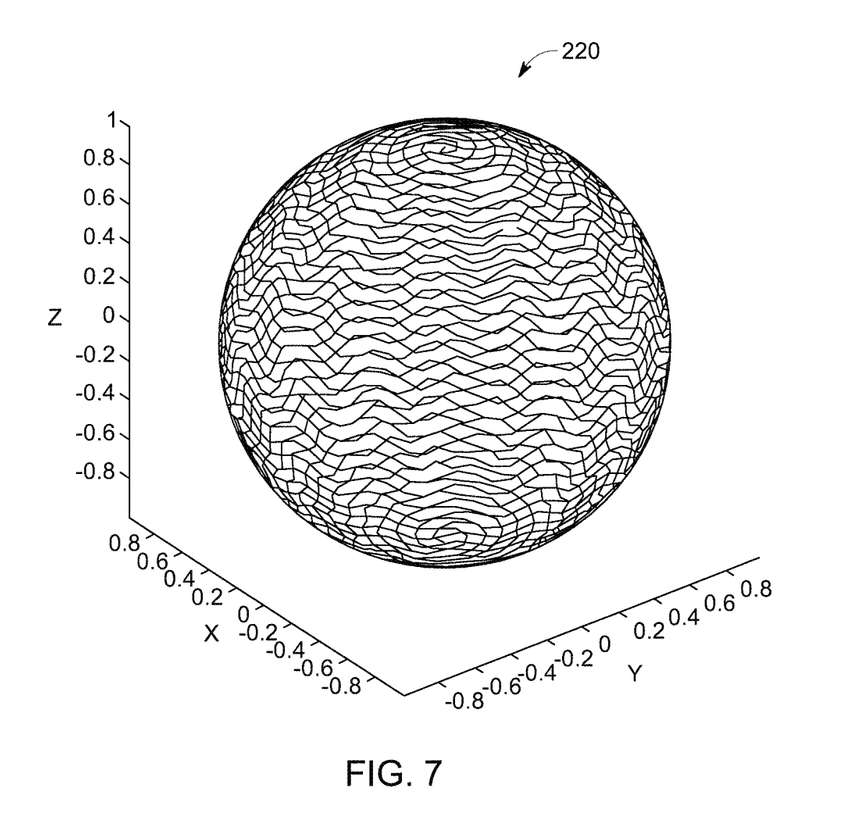
FIG. 7 is a diagram of a modulated spoke end-point trajectory according to an embodiment of the invention.
Figure 8:
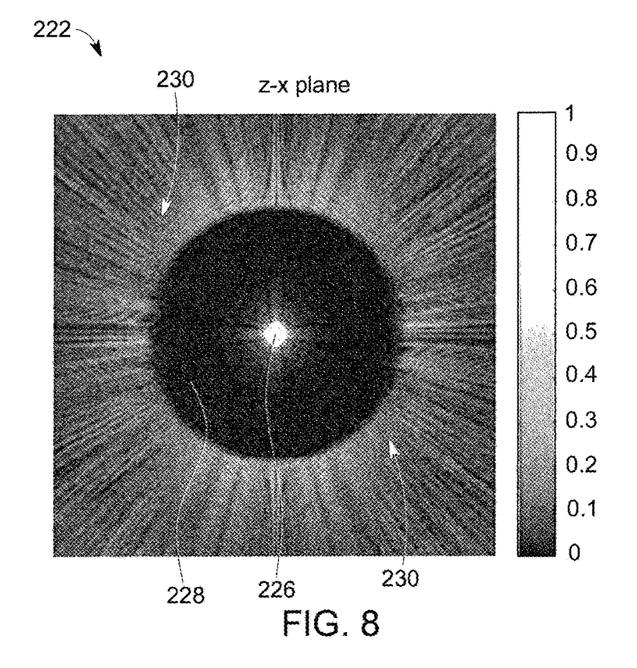
FIG. 8 shows the point spread function for the spoke end-point trajectory shown in FIG. 7, for the z-x plane.
Figure 9:
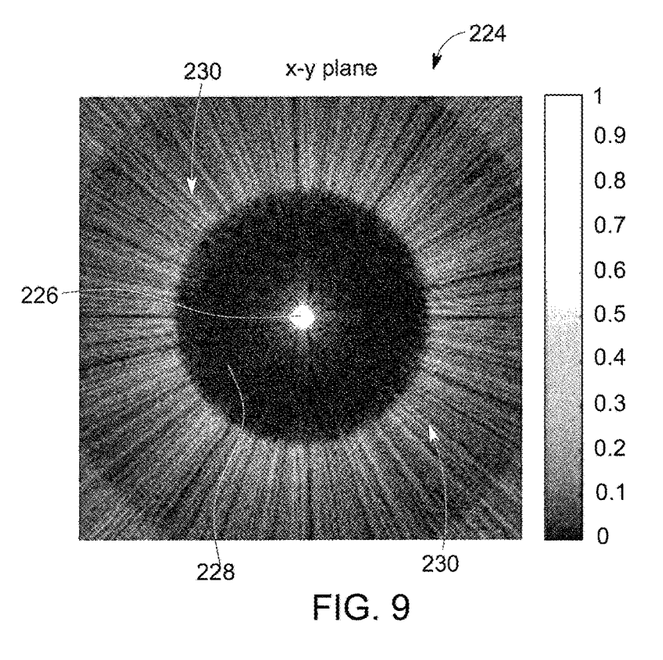
FIG. 9 shows the point spread function for the spoke end-point trajectory shown in FIG. 7, for the x-y plane.

Referring now to FIG. 7 a spoke end point trajectory 220 for the ZTE acquisition scheme with modulation of the polar angle of the trajectory according to an embodiment of the present invention is illustrated. FIGS. 8 and 9 illustrate the corresponding point spread function for the z-x plane 222 and x-y plane 224, respectively. As compared with the PSF of FIGS. 3 and 4, the PSF of FIGS. 8 and 9 is likewise characterized by a bright spot 226 at the center, a region 228 of near zero intensity with a radius equal to the imaging field of view (FOV) (defined by the Nyquist sampling criteria), and then a streaky region 230 outside of that. Noticeably, however, the bright polar region 132 (FIG. 3) has been dispersed in FIGS. 8 and 9. In an embodiment, the form of the modulation of the trajectory's polar angle is:

$$\theta_{new}=\theta_{original}+a\Delta k \sin(\theta_{original})*\cos(n\theta_{original}) \qquad [1]$$

where a and n are parameters to be determined, and $\Delta k$ is the spacing between sampled points. It has been discovered that a=1.5 and n=16 yield good results.

This slight polar angle modulation preserves the original spoke end-point density function. In other embodiments, a slightly randomized trajectory may be utilized (in which case the density function would require a more complicated calculation). In either embodiment, filling k-space in the manner described above therefore allows for the production of a data file in the memory of the system in an electronic format that is electronically accessible in order to generate a magnetic resonance image from the data file. In particular, once the data file is stored in memory, an image can be reconstructed utilizing methods and techniques known in the art.

Figure 10:
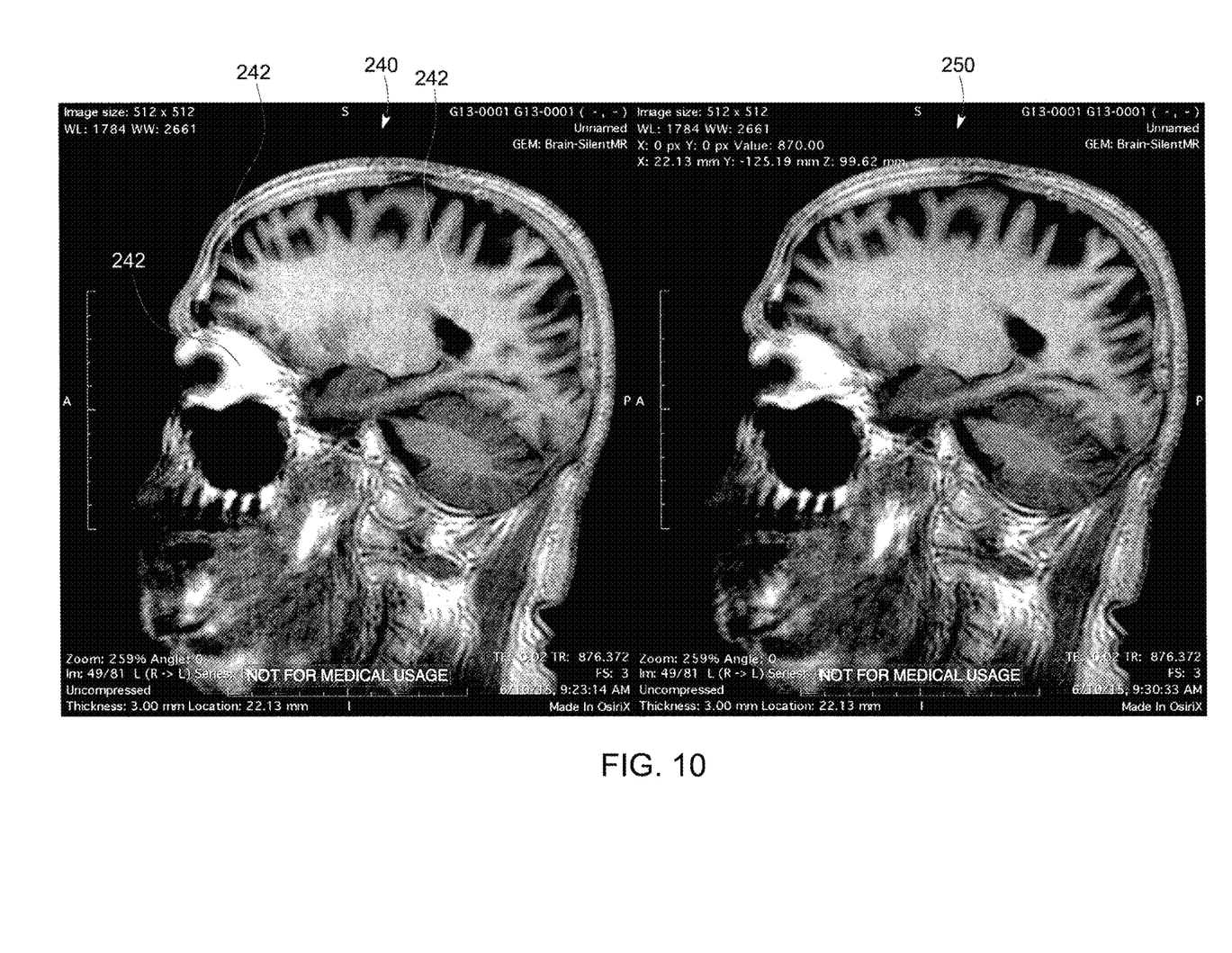
FIG. 10 shows images acquired with the spiral-like trajectory of FIG. 3 and the modulated spiral-like trajectory of FIG. 7, respectively.

FIG. 10 shows images 240, 250 that were acquired axially and then reformatted into the sagittal plane. The image 240 was acquired with the original, smooth, spiral-like trajectory 120 illustrated in FIG. 3, and the image 250 was acquired with the new, modulated spiral-like trajectory 220 of the present invention, shown in FIG. 7. The image 240 shows vertical, streak like artifacts 242, which are substantially absent in the image 250 acquired utilizing the method of the present invention.

As evidenced by the above, the method of the present invention therefor mitigates streak artifacts in axially acquired 3D radial images, such as 3D radial brain images. In connection with this, the method simplifies workflow and can reduce scan time by providing good quality axial images directly, obviating the need to obtain axial images by first acquiring sagittal or coronal images with near isotropic resolution, and then reformatting them onto the axial plane. While the above, described embodiments have been described in connection with the acquisition of brain images, the invention is not so limited in this regard and contemplates imaging any object or volume. Moreover, while the embodiments described above present artifact correction/mitigation in the context of isotropic imaging (i.e., equal spatial resolution and coverage in all three cardinal directions), the same method may be applied for anisotropic imaging.

In an embodiment, a method of magnetic resonance imaging is provided. The method includes the steps of executing an imaging sequence, in response to the imaging sequence, acquiring magnetic resonance data, entering the acquired magnetic resonance data in k-space in a memory along a predetermined k-space trajectory, and modifying the k-space trajectory during acquisition of the magnetic resonance data. In an embodiment, the method may include the step of reconstructing an image from the acquired magnetic resonance data entered in memory. In an embodiment, the image is an axially-acquired three dimensional radial image. In an embodiment, the step of entering the acquired magnetic resonance data in k-space includes entering the data along straight-line radial spokes and defining each of the radial spokes in k-space by one point among a plurality of points on a sphere, and a center point of the sphere, the center point of the sphere coinciding with a center of k-space. The orientation of the radial spokes defines the k-space trajectory, and the step of modifying the k-space trajectory includes modulating a polar angle of the trajectory. In an embodiment, the step of modifying the k-space trajectory includes modulating the polar angle of the trajectory in a regular sinusoidal manner. In another embodiment, the step of modifying the k-space trajectory includes modulating the polar angle of the trajectory in a randomized manner. In an embodiment, the step of modulating the polar angle of the trajectory includes determining a new polar angle, $\theta_{new}$, for each successive point on the sphere according to the equation: $\theta_{new}=\theta_{original}$ a$\Delta$k sin$(\theta_{original})$*cos$(n\theta_{original})$, wherein $\Delta$k is a spacing between adjacent k-space points on the sphere. In an embodiment, a is approximately 1.5, and n is approximately 16.

In another embodiment, a method of mitigating an artifact in an axial-acquired three-dimensional radial image includes the steps of executing an imaging sequence, in response to the imaging sequence, acquiring magnetic resonance data, entering the acquired magnetic resonance data in k-space in a memory along straight-line radial spokes, defining each of the radial spokes in k-space by one point among a plurality of points on a sphere, and a center point of the sphere, the center point of the sphere coinciding with a center of k-space, an orientation of the radial spokes defining a k-space trajectory, and modifying the k-space trajectory during the step of acquiring the magnetic resonance data. In an embodiment, the imaging sequence is a zero echo time three-dimensional radial imaging sequence. In an embodiment, the step of modifying the k-space trajectory includes modulating a polar angle of the trajectory. In an embodiment, the step of modifying the k-space trajectory includes modulating the polar angle of the trajectory in a regular sinusoidal manner. In an embodiment, the step of modulating the polar angle of the trajectory includes determining a new polar angle, $\theta_{new}$, for each successive point on the sphere according to the equation: $\theta_{new}=\theta_{original}$ a$\Delta$k sin$(\theta_{original})$*cos$(n\theta_{original})$, wherein $\Delta$k is a spacing between adjacent k-space points on the sphere. In an embodiment, a is approximately 1.5 and n is approximately 16. In another embodiment, the step of modifying the k-space trajectory may include modulating the polar angle of the trajectory in a randomized manner. In an embodiment, the method may also include the step of producing a data file in the memory in an electronic format that is electronically accessible in order to generate a magnetic resonance image from the data file. In an embodiment, the imaging sequence includes setting a projection gradient to a desired direction and amplitude, generating an RF excitation pulse, applying a gradient encoding of a first predetermined duration, generating a hard pulse of a second predetermined duration, and generating a delay of a third predetermined duration. In an embodiment, the artifact is a streak artifact.

In yet another embodiment, a magnetic resonance imaging system configured for data acquisition of magnetic resonance data in three-dimensional k-space is provided. The system includes a magnetic resonance data acquisition system including a memory into which acquired magnetic resonance data are entered in k-space, and a control unit configured to operate the data acquisition system in order to enter acquired magnetic resonance data in k-space in the memory along straight-line spokes, wherein k-space in said the includes a center of k-space. The memory is configured to define each of the spokes in k-space by one point among a plurality of points on a sphere, and a center point of the sphere, the center point of the sphere coinciding with the center of k-space. The orientation of the radial spokes define a k-space trajectory. The control unit is further configured to modify the k-space trajectory during data acquisition. In an embodiment, the magnetic resonance data is acquired in response to a zero echo time three-dimensional radial imaging sequence carried out by the control unit, and the control unit is configured to modulate a polar angle of the trajectory. In an embodiment, the control unit is configured to modulate the polar angle of the trajectory in a regular sinusoidal manner. In an embodiment, the control unit is configured to determine a new polar angle, $\theta_{new}$, for each successive point on the sphere according to the equation: $\theta_{new}=\theta_{original}+$a$\Delta$k sin$(\theta_{original})$*cos$(n\theta_{original})$, wherein $\Delta$k is a spacing between adjacent k-space points on the sphere, where a is approximately 1.5 and where n is approximately 16.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope.

While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. § 122, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method of magnetic resonance imaging, the method comprising the steps of:
    executing an imaging sequence;
    acquiring magnetic resonance data in response to the imaging sequence;
    entering the acquired magnetic resonance data in k-space in a memory along a predetermined k-space trajectory; and
    modifying the k-space trajectory during acquisition of the magnetic resonance data via modulating a polar angle of the trajectory in at least one of a regular sinusoidal manner and a randomized manner.

2. The method according to claim 1, further comprising the step of:
    reconstructing an image from the acquired magnetic resonance data entered in memory.

3. The method according to claim 2, wherein:
    the image is an axially-acquired three dimensional radial image.

4. The method according to claim 1, wherein:
    the step of modulating the polar angle of the trajectory includes determining a new polar angle, $\theta_{new}$, for each successive point on a sphere centered on k-space according to the equation:

$$\theta_{new} = \theta_{original} + a\Delta k \sin(\theta_{original}) * \cos(n\theta_{original});$$

wherein $\Delta k$ is a spacing between adjacent k-space points on the sphere.

5. The method according to claim 4, wherein:
    a is approximately 1.5; and
    n is approximately 16.

6. A method of mitigating an artifact in an axial-acquired three-dimensional radial image, the method comprising the steps of:
    executing an imaging sequence;
    acquiring magnetic resonance data in response to the imaging sequence;
    entering the acquired magnetic resonance data in k-space in a memory along straight-line radial spokes;
    defining each of the radial spokes in k-space by one point among a plurality of points on a sphere, and a center point of the sphere, the center point of the sphere coinciding with a center of k-space, an orientation of the radial spokes defining a k-space trajectory; and
    modifying the k-space trajectory during the step of acquiring the magnetic resonance data via modulating a polar angle of the trajectory in at least one of a regular sinusoidal manner and a randomized manner.

7. The method according to claim 6, wherein:
    the imaging sequence is a zero echo time three-dimensional radial imaging sequence.

8. The method according to claim 6, wherein:
    the step of modulating the polar angle of the trajectory includes determining a new polar angle, $\theta_{new}$, for each successive point on the sphere according to the equation:

$$\theta_{new} = \theta_{original} + a\Delta k \sin(\theta_{original}) * \cos(n\theta_{original});$$

wherein $\Delta k$ is a spacing between adjacent k-space points on the sphere.

9. The method according to claim 8, wherein:
    a is approximately 1.5; and
    n is approximately 16.

10. The method according to claim 9, further comprising the step of:
    producing a data file in the memory in an electronic format that is electronically accessible in order to generate a magnetic resonance image from the data file.

11. The method according to claim 7, wherein:
    the imaging sequence includes setting a projection gradient to a desired direction and amplitude, generating an RF excitation pulse, applying a gradient encoding of a first predetermined duration, generating a hard pulse of a second predetermined duration, and generating a delay of a third predetermined duration.

12. The method according to claim 6, wherein:
    the artifact is a streak artifact.

13. A magnetic resonance imaging system configured for data acquisition of magnetic resonance data in three-dimensional k-space, comprising:
    a magnetic resonance data acquisition system including a memory into which acquired magnetic resonance data are entered in k-space;
    a control unit configured to operate the data acquisition system in order to enter acquired magnetic resonance data in k-space in the memory along straight-line spokes, wherein k-space in the memory includes a center of k-space;

wherein the memory is configured to define each of the spokes in k-space by one point among a plurality of points on a sphere, and a center point of the sphere, the center point of the sphere coinciding with the center of k-space;

wherein an orientation of the radial spokes define a k-space trajectory; and wherein the control unit is further configured to modify the k-space trajectory during data acquisition via modulating a polar angle of the trajectory in a randomized manner.

14. The magnetic resonance imaging system of claim 13, wherein:

the magnetic resonance data is acquired in response to a zero echo time three-dimensional radial imaging sequence carried out by the control unit.

15. The magnetic resonance imaging system of claim 13, wherein:

the control unit is configured to determine a new polar angle, $\theta_{new}$, for each successive point on the sphere according to the equation:

$$\theta_{new} = \theta_{original} + a\Delta k \, \sin(\theta_{original}) * \cos(n\theta_{original});$$

wherein $\Delta k$ is a spacing between adjacent k-space points on the sphere;

wherein a is approximately 1.5; and wherein n is approximately 16.

* * * * *